(12) United States Patent
Chow et al.

(10) Patent No.: US 8,350,293 B2
(45) Date of Patent: Jan. 8, 2013

(54) FIELD EFFECT TRANSISTOR AND METHOD OF MANUFACTURING THE SAME

(75) Inventors: Tat-Sing Paul Chow, Troy, NY (US); Takehiko Nomura, Tokyo (JP); Yuki Niiyama, Tokyo (JP); Hiroshi Kambayashi, Tokyo (JP); Seikoh Yoshida, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 90 days.

(21) Appl. No.: 12/648,564

(22) Filed: Dec. 29, 2009

(65) Prior Publication Data

US 2010/0219451 A1 Sep. 2, 2010

Related U.S. Application Data

(63) Continuation of application No. 12/228,088, filed on Jun. 11, 2008.

(60) Provisional application No. 61/060,493, filed on Jun. 11, 2008.

(51) Int. Cl.
*H01L 29/08* (2006.01)

(52) U.S. Cl. . 257/192; 257/194; 257/195; 257/E29.255; 257/E29.252

(58) Field of Classification Search .......... 257/192, 257/194, 195, E29.252, 255
See application file for complete search history.

(56) References Cited

U.S. PATENT DOCUMENTS

| 2005/0023555 | A1* | 2/2005 | Yoshida et al. | 257/192 |
| 2007/0090482 | A1* | 4/2007 | Kaneko et al. | 257/492 |
| 2008/0283870 | A1* | 11/2008 | Sato | 257/194 |

* cited by examiner

*Primary Examiner* — Minchul Yang
(74) *Attorney, Agent, or Firm* — Lowe Hauptman Ham & Berner LLP

(57) ABSTRACT

A p-type nitride compound semiconductor layer is formed on a buffer formed on a substrate. An n-type contact region is formed by ion implantation under a source electrode and a drain electrode. An electric-field reducing layer made of an n-type nitride compound semiconductor is formed on the p-type nitride compound semiconductor layer. A carrier density of the electric-field reducing layer is lower than that of the n-type contact region. A first end portion of the electric-field reducing layer contacts with the n-type contact region, and a second end portion of the electric-field reducing layer overlaps with a gate electrode.

7 Claims, 6 Drawing Sheets

FIELD EFFECT TRANSISTOR AND METHOD OF MANUFACTURING THE SAME

CROSS-REFERENCE TO RELATED APPLICATIONS

This application is a continuation application of the prior U.S. patent application Ser. No. 12/228,088 filed Jun. 11, 2008, pending, which claims priority from a provisional patent application Ser. No. 61/060,493 filed on Jun. 11, 2008, the entire content of which is incorporated herein by the reference.

BACKGROUND OF THE INVENTION

1. Field of the Invention

The present invention relates to a field effect transistor and a method of manufacturing the field effect transistor.

2. Description of the Related Art

A wide band-gap semiconductor such as a III-V nitride compound is preferably used as a material for high-power, high-frequency, and high-temperature semiconductor devices, because the wide band-gap semiconductor has high breakdown voltage and good thermal conductivity. For example, a field effect transistor (FET) having an aluminum gallium nitride/gallium nitride (AlGaN/GaN) hetero-structure induces two-dimensional electron gas at an interface by piezoelectric effect. The two-dimensional electron gas has high electron mobility and high carrier density so that it is widely tested for a practical use. In addition, an AlGaN/GaN hetero-structure field effect transistor (HFET) has a low ON-resistance and a fast switching speed, which realizes a high temperature operation. The above characteristics are preferable for power switching application.

Generally, the AlGaN/GaN HFET is configured as a normally-on type device, in which a current flows when a bias is not applied to a gate, and the current is blocked when a negative potential is applied to the gate. For the power switching application, it is more preferable to use a normally-off type device, in which a current is blocked when a bias is not applied to the gate, and the current flows when a positive potential is applied to the gate, so that a security is assured even when a failure occurs in a device.

To realize the normally-off type device, it is necessary to employ a metal-oxide-semiconductor field-effect transistor (MOSFET) structure. FIG. 12 is a schematic side view of a conventional MOSFET 800. A buffer layer 802 and a p-type gallium nitride (p-GaN) layer 803 are grown in this order on a substrate 801 in the MOSFET 800. Two n$^+$-GaN regions 805 and 806, as contact layers to realize an ohmic contact between source and drain regions, are grown on a portion of the p-GaN layer 803 by an ion implantation method. An n$^-$-GaN layer 804 called a reduced surface field (RESURF) layer is grown between gate and drain regions by the ion implantation method, so that an electric field between the gate and the drain regions is reduced and a breakdown voltage of the device is improved.

An oxide film 807 made of silicon dioxide (SiO$_2$) or the like is grown between a source electrode 809 and a drain electrode 810, and a gate electrode 808 is grown on the oxide film 807. The gate electrode 808 is generally made of polysilicon (Si), and may be made of a metal such as nitride/gold (Ni/Au) or tungsten silicide (WSi). The source electrode 809 and the drain electrode 810 are grown on the n$^+$-GaN regions 805 and 806, respectively. The source electrode 809 and the drain electrode 810 are made of a metal that realizes the ohmic contact to the n$^+$-GaN region, such as titanium/aluminum (Ti/Al) or titanium/aluminum silicon/molybdenum (Ti/AlSi/Mo).

For realizing preferable channel mobility, the MOSFET needs to be configured such that a low interface state is maintained between the oxide film and the semiconductor. With a normal Si-based MOSFET, an SiO$_2$ thermally-oxidized film made of thermally-oxidized Si is used as the oxide film, so that a preferably low interface state is realized. On the other hand, with a nitride-compound-based MOSFET, a preferable thermally-oxidized film cannot be obtained, so that the oxide film is generally formed from SiO$_2$ by a physical and chemical vapor deposition (p-CVD) method.

For forming the n$^+$-GaN region and the n$^-$-GaN region, the ion implantation method is conventionally used as described above. In the ion implantation method, an annealing process is performed for restoring a crystal defect and activating an implanted impurity ion after implanting a predetermined impurity ion. When the semiconductor is made of GaN, because crystal binding is strong, the annealing process needs to be performed at a high temperature such as 1,000° C.

On the other hand, an activation ratio of the impurity ion depends on a dose amount such that the activation ratio increases as the dose amount increases. Accordingly, even when the annealing condition for completely activating the impurity ion in the n$^+$-GaN region with the large dose amount is employed, the activation ratio of the impurity ion in the n$^-$-GaN region does not reach 100%, resulting in an insufficient activation. When the impurity ion is not sufficiently activated in the n$^-$-GaN region, a leakage current increases, the electron mobility in the n$^-$-GaN region as the RESURF layer is degraded, and resistance of the n$^-$-GaN region increases due to the inactive impurity ion. Furthermore, when the crystal defect is not sufficiently restored, the leakage current increases and the electron mobility in the n$^-$-GaN region is degraded.

For completely activating the impurity ion in the n$^-$-GaN region to solve the above problems, it is necessary to perform the annealing process at a high temperature such as 1,300° C. or higher. When the annealing process is performed at a temperature of 1,300° C. for a long time, pits occur on the surface of a GaN crystal, thereby degrading a quality of the GaN/SiO$_2$ interface and channel mobility.

On the other hand, when the dose amount of the impurity ion is increased for recovering the degradation of the electron mobility in the n$^-$-GaN region, a difference between electron densities of the n$^+$-GaN region and the n$^-$-GaN region becomes small, resulting in a degradation of an effect of reducing the electric field of the n$^-$-GaN region and a failure to assure a desired breakdown voltage.

SUMMARY OF THE INVENTION

It is an object of the present invention to at least partially solve the problems in the conventional technology.

According to a first aspect of the present invention, a field effect transistor having a metal-oxide-semiconductor structure includes a buffer layer formed on a substrate; a p-type nitride compound semiconductor layer formed on the buffer layer; an n-type contact region formed by ion implantation under a source electrode and a drain electrode; and an electric-field reducing layer made of an n-type nitride compound semiconductor and formed on the p-type nitride compound semiconductor layer. A carrier density of the electric-field reducing layer is lower than that of the n-type contact region. A first end portion of the electric-field reducing layer contacts with the n-type contact region, and a second end portion of the electric-field reducing layer overlaps with a gate electrode.

According to a second aspect of the present invention, a field effect transistor having a metal-oxide-semiconductor structure includes a buffer layer formed on a substrate; a p-type nitride compound semiconductor layer formed on the buffer layer; an n-type contact region formed by ion implantation under a source electrode and a drain electrode; and an aluminum gallium nitride layer formed on the p-type nitride compound semiconductor layer. A first end portion of the aluminum gallium nitride layer contacts with the n-type contact region, and a second end portion of the aluminum gallium nitride layer overlaps with a gate electrode. Two-dimensional electron gas is generated around an interface state between the p-type nitride compound semiconductor layer and the aluminum gallium nitride layer, which forms an electric-field reducing region.

According to a third aspect of the present invention, a method of manufacturing a field effect transistor having a metal-oxide-semiconductor structure includes the steps of forming a buffer layer on a substrate; forming a p-type nitride compound semiconductor layer on the buffer layer; forming an n-type contact region by ion implantation under a source electrode and a drain electrode; and forming an electric-field reducing layer made of an n-type nitride compound semiconductor on the p-type nitride compound semiconductor layer. A carrier density of the electric-field reducing layer is lower than that of the n-type contact region; a first end portion of the electric-field reducing layer contacts with the n-type contact region; and a second end portion of the electric-field reducing layer overlaps with a gate electrode.

According to a fourth aspect of the present invention, a method of manufacturing a field effect transistor having a metal-oxide-semiconductor structure includes the steps of forming a buffer layer on a substrate; forming a p-type nitride compound semiconductor layer on the buffer layer; forming an n-type contact region by ion implantation under a source electrode and a drain electrode; and forming an aluminum gallium nitride layer on the p-type nitride compound semiconductor layer. A first end portion of the aluminum gallium nitride layer contacts with the n-type contact region; a second end portion of the aluminum gallium nitride layer overlaps with a gate electrode; and two-dimensional electron gas is generated around an interface state between the p-type nitride compound semiconductor layer and the aluminum gallium nitride layer, which forms an electric-field reducing region.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the accompanying drawings.

Figure 1:
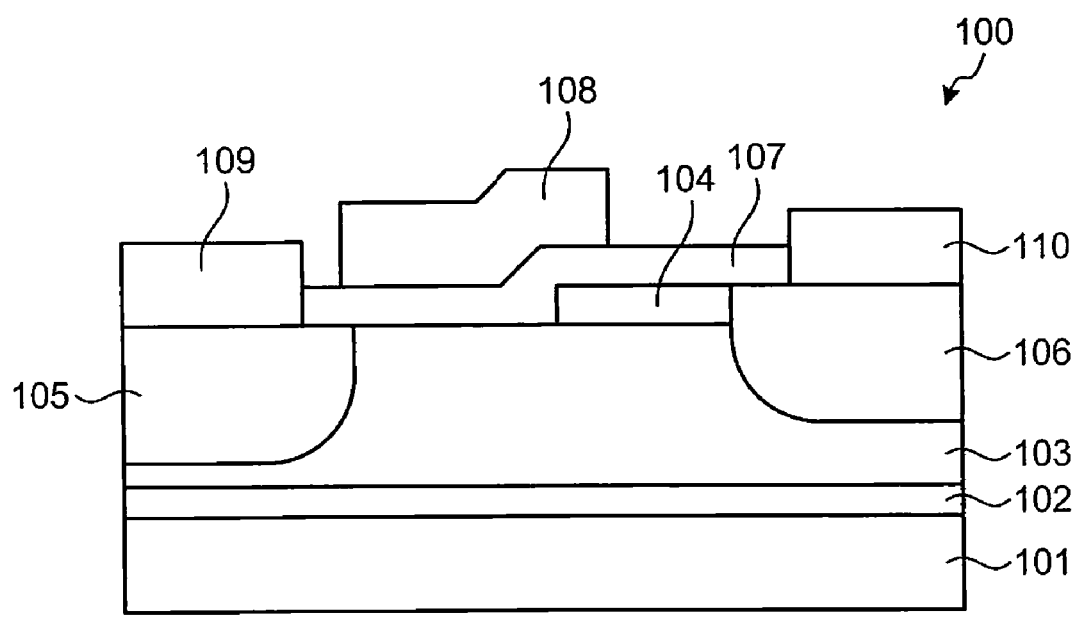
FIG. 1 is a schematic side view of a metal-oxide-semiconductor filed-effect transistor (MOSFET) according to a first embodiment of the present invention.

FIG. 1 is a schematic side view of a MOSFET 100 according to a first embodiment of the present invention. The MOSFET 100 is configured in such a manner that a buffer layer 102 formed with alternate layers of an aluminum nitride (AlN) and a gallium nitride (GaN), and a p-GaN layer 103 are grown on a substrate 101 made of sapphire, silicon carbide (SiC), silicon (Si), or the like. Two $n^+$-GaN regions 105 and 106 are grown on portions of the p-GaN layer 103, and an $n^-$-GaN layer 104 is grown on a different portion of the p-GaN layer 103. A source electrode 109 is grown on the $n^+$-GaN region 105 and a drain electrode 110 is grown on the $n^+$-GaN region 106. A silicon dioxide ($SiO_2$) film 107 is grown on the p-GaN layer 103 and the $n^-$-GaN layer 104, and a gate electrode 108 is grown on the $SiO_2$ film 107. The $n^-$-GaN layer 104 is configured in such a manner that one end portion of the $n^-$-GaN layer 104 contacts with the $n^+$-GaN region 106, and another end portion of the $n^-$-GaN layer 104 overlaps the gate electrode 108 on the side of the drain electrode 110, so that the $n^-$-GaN layer 104 functions as a reduced surface field (RESURF) layer.

In the MOSFET 100, the $n^-$-GaN layer 104 that serves as the RESURF layer is formed by an epitaxial growth, while the $n^+$-GaN regions 105 and 106 are formed by an ion implantation method. Accordingly, little inactive impurity ion in the $n^-$-GaN layer 104 is generated, so that the MOSFET 100 can be such MOSFET that has high electron mobility, causes little leakage current, and is low on resistance.

Figure 2:
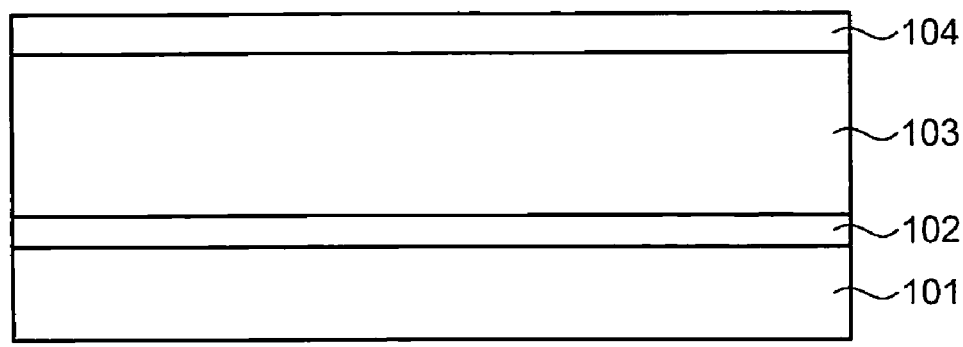
FIG. 2 is a schematic diagram for explaining a method of fabricating the MOSFET shown in FIG. 1.
Figure 3:
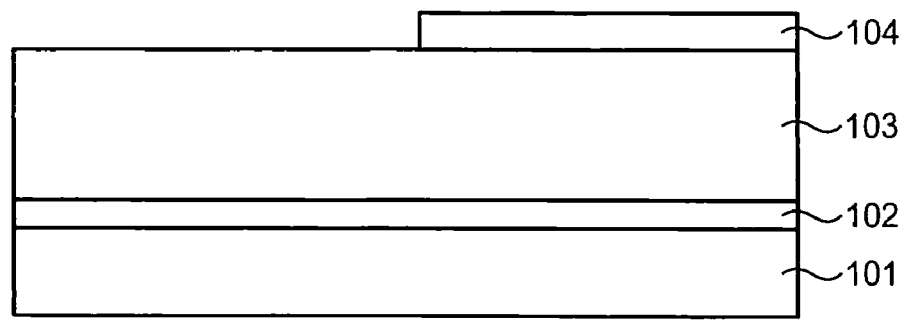
FIG. 3 is a schematic diagram for explaining a method of fabricating the MOSFET shown in FIG. 1.
Figure 4:
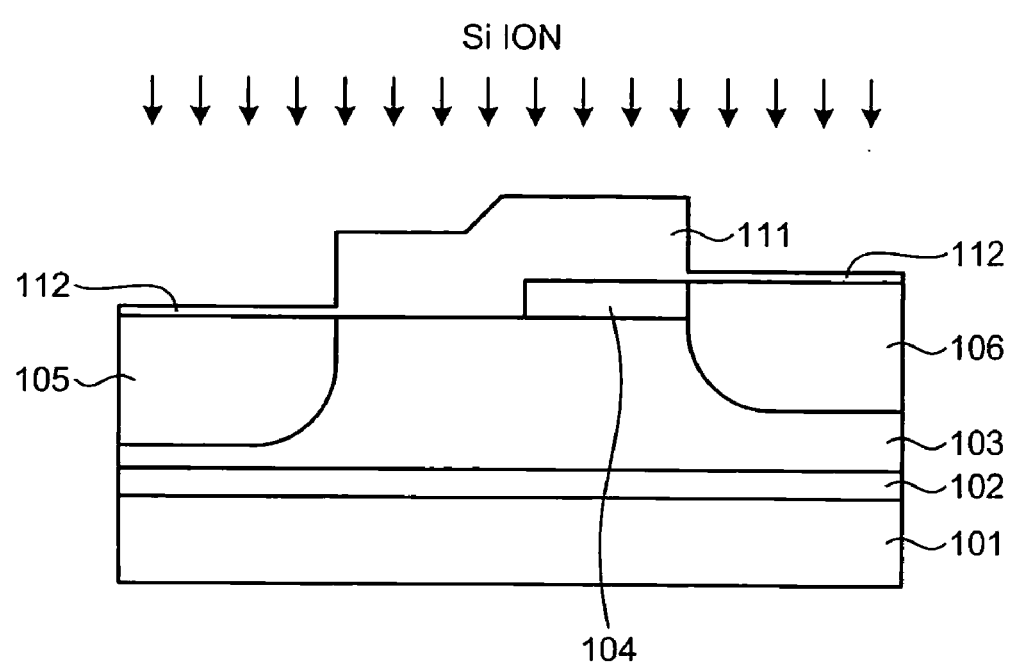
FIG. 4 is a schematic diagram for explaining a method of fabricating the MOSFET shown in FIG. 1.

A method of fabricating the MOSFET 100 is explained with reference to FIGS. 2 to 4. The buffer layer 102, the p-GaN layer 103, and the $n^-$-GaN layer 104 are grown on the substrate 101 by the epitaxial growth using Metal Organic Chemical Vapor Deposition (MCVD). In this case, a dopant to be doped to the p-GaN layer 103 is magnesium (Mg), and a Mg doping concentration is approximately $5 \times 10^{15}$ cm$^{-3}$ to $1 \times 10^{17}$ cm$^{-3}$. On the other hand, the $n^-$-GaN layer 104 has a thickness of 1 micrometer, which is doped with a Si doping concentration of $1 \times 10^{13}$ cm$^{-2}$.

A patterning is performed on a portion of the $n^-$-GaN layer 104 by a photolithography. As shown in FIG. 3, a portion of the $n^-$-GaN layer 104 is etched using a patterning mask obtained by the above patterning, so that a portion of the p-GaN layer 103 is exposed. In this case, it is preferable to use a dry etching method such as an inductively coupled plasma (ICP) dry etching.

A mask used for implanting ion to fabricate the $n^+$-GaN regions 105 and 106 is formed on the source and the drain regions through the following processes. An SiO$_2$ film 111 with a thickness of 1,000 nanometers is deposited on an entire top surface of the substrate 101 (the substrate 101 on which the buffer layer 102, the p-GaN layer 103, and the n$^-$-GaN layer 104 are formed is collectively referred to as the substrate 101 as appropriate) by plasma chemical vapor deposition (p-CVD). Subsequently, portions of the SiO$_2$ film 111, which correspond to regions of the n$^+$-GaN regions 105 and 106, are etched by using a mask obtained by the photolithography. An SiO$_2$ film 112 with a thickness of 20 nanometers for protecting a surface is deposited on an entire surface of the SiO$_2$ film 111. As shown in FIG. 4, ion from Si ion is subsequently implanted into the substrate on which the mask is formed through the above process to fabricate the n$^+$-GaN regions 105 and 106. The dose amount for the ion implantation is preferably $3 \times 10^{15}$ cm$^{-2}$.

The entire SiO$_2$ films 111 and 112 are removed by buffered hydrofluoric acid (BHF), and a cap layer is deposited on the entire top surface of the substrate 101 as a protection layer for performing an annealing process, in which impurity ion is freshly activated. In the first embodiment, the cap layer is made of SiO$_2$ and may be made of AlN, graphite, or the like. The annealing process is further performed for activating impurity ion included in the n$^+$-GaN regions 105 and 106. The annealing process is performed for 5 minutes in an annealing furnace with a temperature of 1,100° C. in the presence of nitride (N2). According to the above fabrication method, the n$^+$-GaN regions 105 and 106 are exclusively targeted to activate the impurity ion, where the dose amount is substantially large and impurity ion is easily activated, so that the annealing process is not necessarily performed for a long time at a high temperature. Accordingly, pits hardly occur on the surface of GaN crystal and channel mobility is hardly degraded. After completing the annealing process, the cap layer is removed by an appropriate method such as a method using the BHF.

The SiO$_2$ film 107 with a thickness of 100 nanometers is deposited on the entire top surface of the substrate 101 for forming a metal-oxide-semiconductor (MOS) structure, and the annealing process is performed for 30 minutes at a temperature of 900° C. in the presence of nitride (N$_2$) to a lower interface state. Subsequently, poly-Si with a thickness of 650 nanometers is deposited, which is to become the gate electrode. The substrate 101 is annealed for 20 minutes in a furnace with an internal temperature of 900° C. in the presence of phosphorus oxychloride (POCl$_3$), so that p-doping is performed to the poly-Si to fabricate the poly-Si to be an n$^+$-type.

A photolithography is performed for defining a gate region, and unnecessary poly-Si is etched through reactive ion etching (RIE) to fabricate the gate electrode 108. The gate electrode 108 is configured in such a manner that a portion of the gate electrode 108 overlaps the n$^-$-GaN layer 104.

Portions of the SiO$_2$ film 107, which correspond to the n$^+$-GaN regions 105 and 106, are etched to fabricate the source electrode 109 and the drain electrode 110, so that the MOSFET 100 is completely fabricated.

Figure 5:
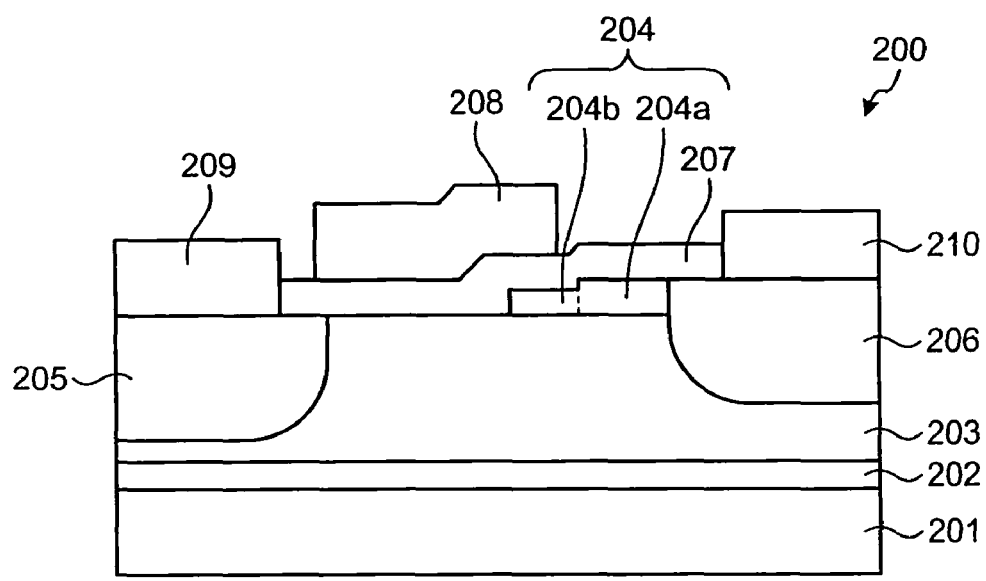
FIG. 5 is a schematic side view of a MOSFET according to a second embodiment of the present invention.

FIG. 5 is a schematic side view of a MOSFET 200 according to a second embodiment of the present invention. Similarly to the MOSFET 100, the MOSFET 200 is configured with a buffer layer 202 and a p-GaN layer 203 grown in that order on a substrate 201. Two n$^+$-GaN regions 205 and 206 are grown on portions of the p-GaN layer 203, and an n$^-$-GaN layer 204 is grown on a different portion of the p-GaN layer 203. A source electrode 209, a drain electrode 210, an SiO$_2$ film 207, and a gate electrode 208 are further grown on the substrate 201.

The n$^-$-GaN layer 204 is configured in such a manner that one end portion of the n$^-$-GaN layer 204 comes contact with the n$^+$-GaN region 206, and another end portion of the n$^-$-GaN layer 204 overlaps the gate electrode 208 on the side of the drain electrode 210, so that the n$^-$-GaN layer 204 functions as the RESURF layer.

In the MOSFET 200, the n$^-$-GaN layer 204 serving as the RESURF layer is formed by the epitaxial growth, while the n$^+$-GaN regions 205 and 206 are formed by the ion implantation method. Accordingly, similar to the MOSFET 100, little inactive impurity ion exists in the n$^-$-GaN layer 204, so that the MOSFET 200 can be such MOSFET that has high electron mobility, causes little leakage current, and is low on resistance.

The n$^-$-GaN layer 204 is configured with an n$^-$-GaN layer 204a grown adjacent to the n$^+$-GaN region 206 and an n$^-$-GaN layer 204b grown adjacent to the n$^-$-GaN layer 204a. In this case, the n$^-$-GaN layers 204a and 204b are configured in such a manner that a carrier density of each of the n$^-$-GaN layer 204a and the n$^-$-GaN layer 204b is the same with each other while a thickness of the n$^-$-GaN layer 204b is thinner than that of the n$^-$-GaN layer 204a. Accordingly, the sheet resistance of the n$^-$-GaN layer 204b becomes higher than the sheet resistance of the n$^-$-GaN layer 204a, so that a resistance of the n$^-$-GaN layer 204 as the RESURF layer is increased from the drain side to the gate side, resulting in reducing a concentration of electric field. Therefore, the MOSFET 200 can have high breakdown voltage. Although the n$^-$-GaN layer 204 is configured with two layers each having different thickness in the MOSFET 200, the n$^-$-GaN layer can be configured with two layers each having the same thickness and different carrier density, so that the resistance is increased from the drain side to the gate side. In addition, the n$^-$-GaN layer can be configured with three or more layers.

The n$^-$-GaN layer 204 described above can be realized by forming an n$^-$-GaN layer with a uniform thickness and subsequently etching a portion of the n$^-$-GaN layer on the gate side to fabricate a thin n$^-$-GaN layer.

Figure 6:
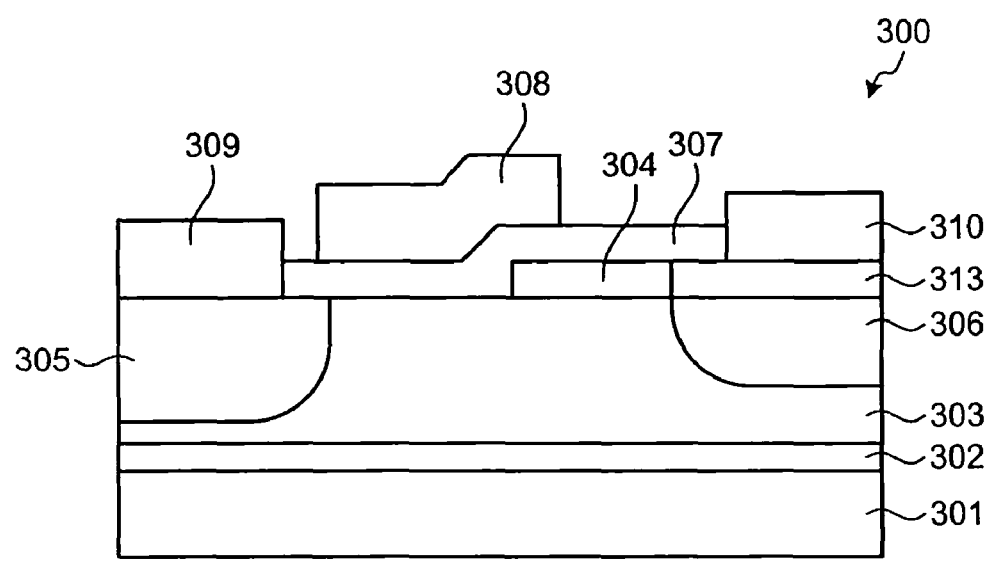
FIG. 6 is a schematic side view of a MOSFET according to a third embodiment of the present invention.

FIG. 6 is a schematic side view of a MOSFET 300 according to a third embodiment of the present invention. Similarly to the MOSFET 100, the MOSFET 300 is configured with a buffer layer 302 and a p-GaN layer 303 grown in that order on a substrate 301. Two n$^+$-GaN regions 305 and 306 are grown on portions of the p-GaN layer 303. A source electrode 309, a drain electrode 310, an SiO$_2$ film 307, and a gate electrode 308 are further grown on the substrate 301. On the other hand, an n$^+$-aluminum gallium nitride (AlGaN) layer 313 is grown on the n$^+$-GaN region 306, which is different from the MOSFET 100. In addition, an AlGaN layer 304 is grown on the p-GaN layer 303 in such a manner that one end portion of the AlGaN layer 304 comes contact with the n$^+$-AlGaN layer 313 and another end portion overlaps the gate electrode 308 on the side of the drain electrode 310.

The AlGaN layer 304 is formed on the p-GaN layer 303 by the epitaxial growth in the MOSFET 300. Accordingly, an AlGaN/GaN hetero-structure is formed, so that two-dimensional electron gas is generated around an interface between the p-GaN layer 303 and the AlGaN layer 304 by spontaneous polarization and piezoelectric polarization. In the MOSFET 300, a region where the two-dimensional electron gas is generated functions as the RESURF region, resulting in realizing the MOSFET that has high electron mobility, causes low leakage current, and is low on resistance.

The MOSFET 300 can be fabricated almost similarly to the MOSFET 100. Alternately, the AlGaN layer 304 instead of the n$^-$-GaN layer 104 is formed by the epitaxial growth and a portion of the AlGaN layer 304 is etched for the MOSFET 300. The n+-AlGaN layer 313 is formed at the same time when the n+-GaN region 306 is formed by the ion implantation method. Similarly to the MOSFET 100, the n+-GaN regions 305 and 306 are exclusively targeted to activate the impurity ion, so that the annealing process is not necessarily performed for a long time at a high temperature. Accordingly, pits hardly occur on the surface of GaN crystal and channel mobility is hardly degraded.

Similarly to the MOSFET 200, the AlGaN layer 304 can be formed so that the thickness of the AlGaN layer 304 is decreased from the drain side to the gate side in the MOSFET 300. By configuring the AlGaN layer 304 in the above manner, a density of the two-dimensional electron gas generated in the p-GaN layer 303 can be decreased from the drain side to the gate side, resulting in increasing a resistance of the two-dimensional electron gas region that functions as the RESURF region. As a result, the concentration of the electric field can be reduced, resulting in realizing the MOSFET 300 with high breakdown voltage.

Figure 7:
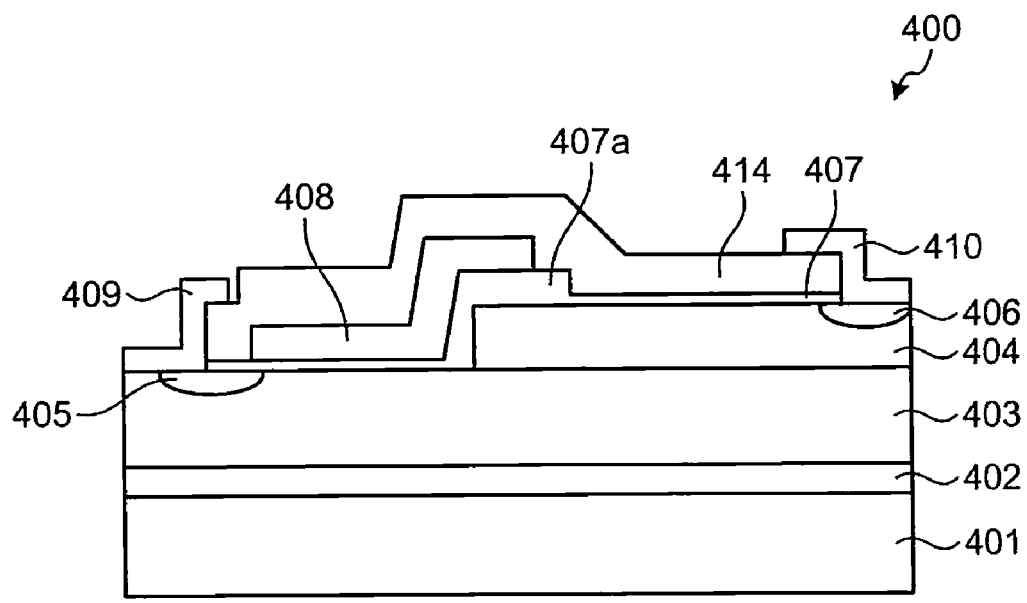
FIG. 7 is a schematic side view of a MOSFET according to a fourth embodiment of the present invention.

FIG. 7 is a schematic side view of a MOSFET 400 according to a fourth embodiment of the present invention. The MOSFET 400 includes a substrate 401, and a buffer layer 402 and a p-GaN layer 403 which are formed on the substrate 401 as with the MOSFET 100, but is different from the MOSFETs 100 to 300 in that an n+-GaN region 406 is formed on a portion of an n−-GaN layer 404. A field-oxidized film 407a made of SiO₂ for reducing electric field is formed on a portion of the n−-GaN layer 404, which overlaps a gate electrode 408. An interlayer insulating film 414 made of SiO₂ is formed on an SiO₂ film 407. The n−-GaN layer 404 as the RESURF layer is formed by the epitaxial growth in the MOSFET 400, so that the MOSEFT 400 can be such that has high electron mobility, causes low leakage current, and is low on resistance.

Figure 8:
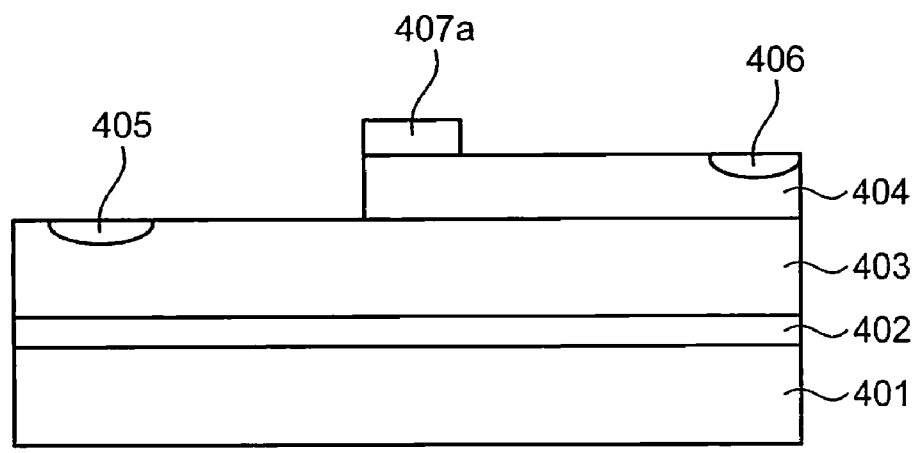
FIG. 8 is a schematic diagram for explaining a method of fabricating the MOSFET shown in FIG. 7.
Figure 9:
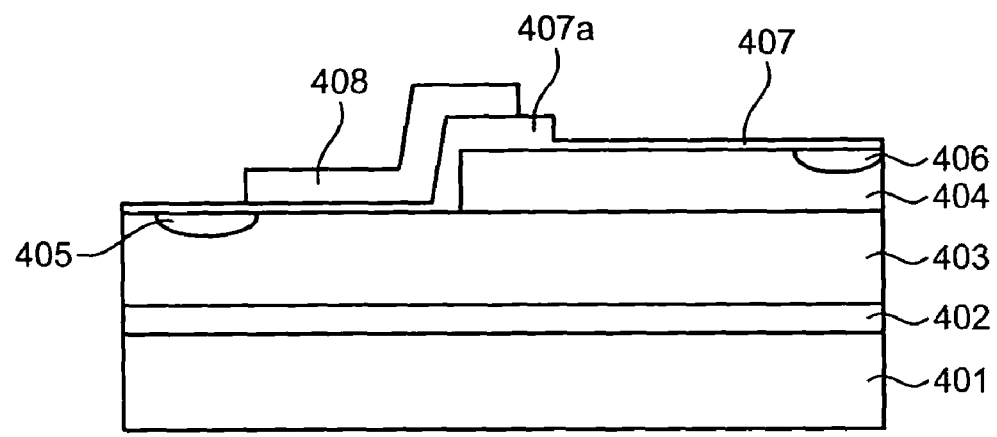
FIG. 9 is a schematic diagram for explaining a method of fabricating the MOSFET shown in FIG. 7.

The MOSFET 400 can be fabricated in the same manner as that of the MOSFET 100 except the following processes. After the cap layer as the protection layer is removed, an SiO₂ film with a thickness of 500 nanometers is coated on the entire top surface of a substrate 401. A patterning is subsequently performed so that the field-oxidized film 407a is remained on the end portion of the n−-GaN layer 404 as shown in FIG. 8. Thereafter, the SiO₂ film 407 and the gate electrode 408 are formed as shown in FIG. 9. The SiO₂ film to be the interlayer insulating film 414 with a thickness of 1 nanometer is subsequently coated. A patterning is performed by the photolithography and a portion of the SiO₂ film corresponding to the source and the drain electrodes is opened through the etching, so that the interlayer insulating film 414 is formed and a source electrode 409 and a drain electrode 410 are formed through a liftoff process. As for the electrode, a titanium/gold electrode (Ti/Au of 50 nanometers/200 nanometers) or the like is used. An opening for the gate electrode 408 is formed on the interlayer insulating film 414 and wiring of the electrode such as titanium/molybdenum/gold (Ti/Mo/Au) is performed to complete the fabrication of the MOSFET 400.

Figure 10:
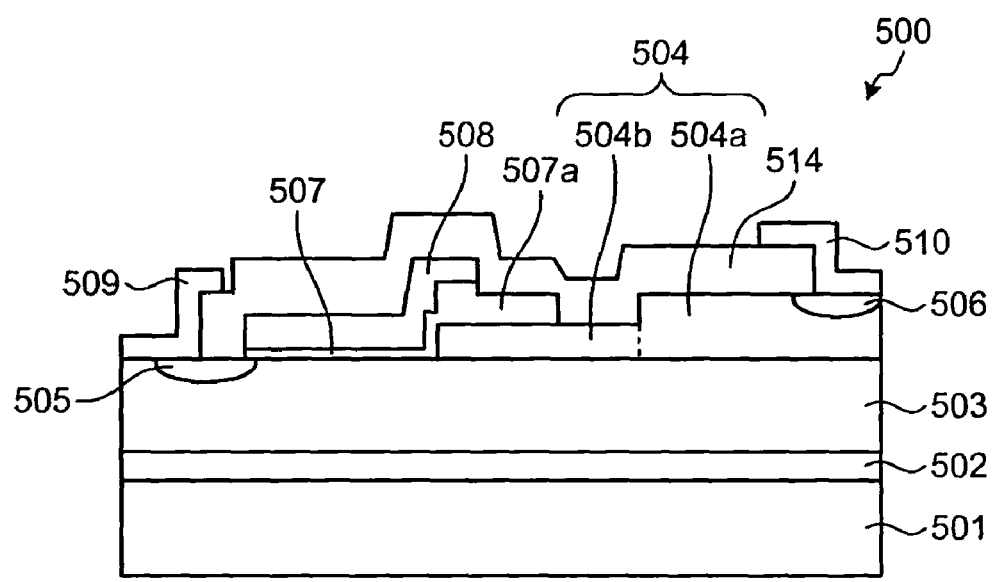
FIG. 10 is a schematic side view of a MOSFET according to a fifth embodiment of the present invention.

FIG. 10 is a schematic side view of a MOSFET 500 according to a fifth embodiment of the present invention. The MOSFET 500 includes a substrate SOl, and a buffer layer 502 and a p-GaN layer 503 which are formed on the substrate 501 as with the MOSFET 400. In the MOSFET 500, an n+-GaN region 506 is formed on a portion of an n−-GaN layer 504, and a field oxidized film 507a for reducing the electric field and an interlayer insulating film 514 are further formed. In addition, similarly to the MOSFET 200, the n−-GaN layer 504 is configured with two layers of an n−-GaN layer 504a and an n−-GaN layer 504b in such a manner that the sheet resistance of the n−-GaN layer 504b is higher than the sheet resistance of the n−-GaN layer 504a. As a result, similarly to the MOSFET 200, the MOSFET 500 has high breakdown voltage.

Figure 11:
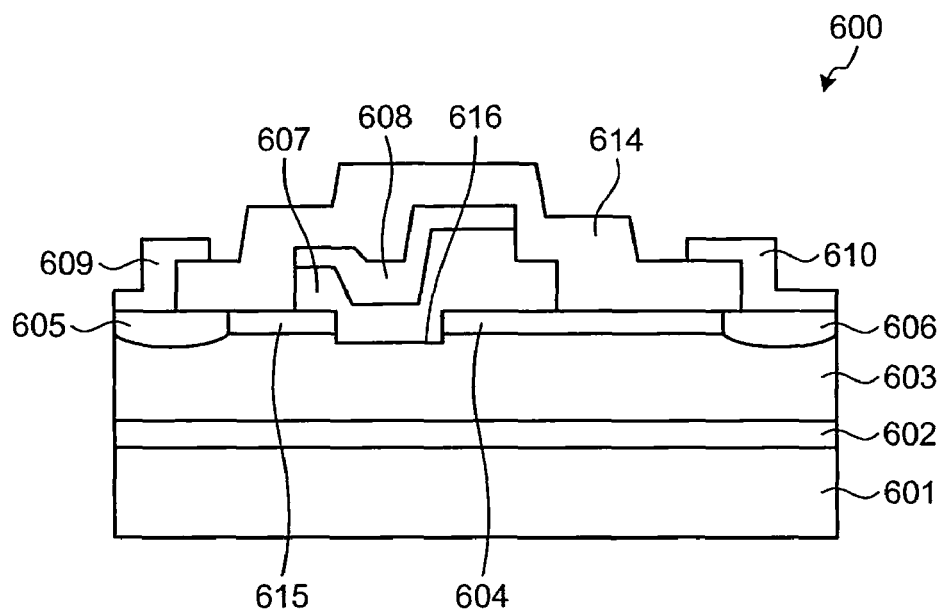
FIG. 11 is a schematic side view of a MOSFET according to a sixth embodiment of the present invention.
Figure 12:
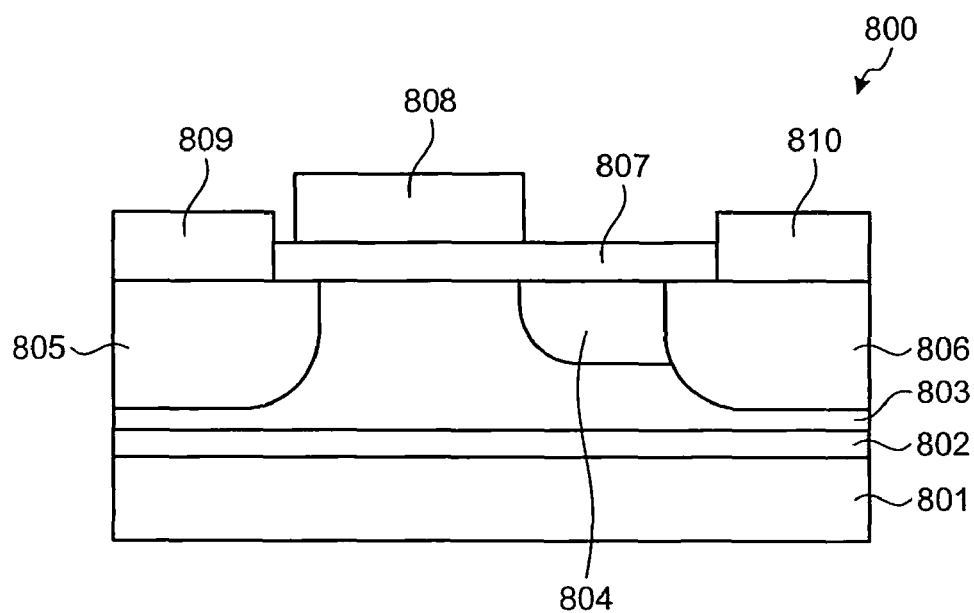
FIG. 12 is a schematic side view of a conventional MOSFET.

FIG. 11 is a schematic side view of a MOSFET 600 according to a sixth embodiment of the present invention. The MOSFET 600 is configured with a buffer layer 602, an intrinsic GaN (i-GaN) layer 603 grown in that order on a substrate 601. Two n+-GaN regions 605 and 606 are grown on the portion of the i-GaN layer 603, and an AlGaN layers 615 and 604 are formed adjacent to the n+-GaN regions 605 and 606, respectively. A groove 616 that reaches the i-GaN layer 603 is formed between the AlGaN layers 615 and 604. A source electrode 609, a drain electrode 610, an SiO₂ film 607, a gate electrode 608, and an interlayer insulating film 614 are grown on the substrate 601.

The AlGaN layer 604 is formed by the epitaxial growth on the i-GaN layer 603 in the MOSFET 600. Accordingly, the AlGaN/GaN hetero-structure is formed, so that the two-dimensional electron gas is generated around an interface between the i-GaN layer 603 and the AlGaN layer 604. In this case, a region where the two-dimensional electron gas is generated functions as the RESURF region. As a result, the MOSFET 600 can be such that has high electron mobility, causes low leakage current, and is low on resistance.

For fabricating the MOSFET 600, the AlGaN layer 604 is formed by the epitaxial growth on the i-GaN layer 603 and a portion of a region where the RESURF region is formed on the AlGaN layer 604 is subsequently etched, so that a portion of the region where the drain electrode 610 is formed and a portion adjacent to a region where the source electrode 609 is formed are remained, resulting in completing the fabrication of the AlGaN layers 615 and 604.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:
1. A field effect transistor having a metal-oxide-semiconductor structure, the field effect transistor comprising:
   a buffer layer formed on a substrate;
   a p-type nitride compound semiconductor layer formed on the buffer layer;
   an n-type contact region formed by ion implantation under a source electrode and a drain electrode; and
   an electric-field reducing layer made of an n-type nitride compound semiconductor and epitaxially-grown on the p-type nitride compound semiconductor layer, wherein
   the electric-field reducing layer has a carrier density lower than that of the n-type contact region,
   the electric-field reducing layer includes a first end portion contacting with the n-type contact region and a second end portion overlapping a gate electrode,
   the n-type contact region formed under the drain electrode is formed in the electric-field reducing layer, and
   the carrier density of the electric-field reducing layer varies in different regions of the electric-field reducing layer to increase a resistance of the electric-field reducing layer in a direction from the first end portion toward the second end portion.

2. The field effect transistor according to claim 1, wherein the resistance of the electric-field reducing layer increases from a side of the drain electrode toward a side of the gate electrode in a gradual manner or in a continuous manner.

3. The field effect transistor according to claim 1, wherein the electric-field reducing layer has a thickness decreasing from a side of the drain electrode toward a side of the gate electrode in a gradual manner or in a continuous manner.

4. The field effect transistor according to claim 1, wherein the electric-field reducing layer has a uniform thickness from the first end portion where the electric-field reducing layer directly contacts the n-type contact region formed under the drain electrode to the second end portion where the electric-field reducing layer overlaps and underlies the gate electrode.

5. The field effect transistor according to claim 1, wherein the first end portion of the electric-field reducing layer is thicker than the second end portion and defines a step with the second end portion.

6. The field effect transistor according to claim 5, wherein a sheet resistance of the first end portion is lower than that of the second end portion.

7. The field effect transistor according to claim 5, wherein the n-type contact region formed under the drain electrode is formed in the second end portion of the electric-field reducing layer.

* * * * *